(12) United States Patent
Hseih

(10) Patent No.: US 6,593,607 B1
(45) Date of Patent: Jul. 15, 2003

(54) IMAGE SENSOR WITH ENHANCED BLUE RESPONSE AND SIGNAL CROSS-TALK SUPPRESSION

(75) Inventor: Biay-Cheng Hseih, Irvine, CA (US)

(73) Assignee: Pictos Technologies, Inc., Newport Beach, CA (US)

( * ) Notice: Subject to any disclaimer, the term of this patent is extended or adjusted under 35 U.S.C. 154(b) by 0 days.

(21) Appl. No.: 09/408,454

(22) Filed: Sep. 30, 1999

(51) Int. Cl.[7] .................... H01L 31/062; H01L 31/06
(52) U.S. Cl. .................... 257/292; 257/291; 257/461; 257/463
(58) Field of Search .................... 257/292, 291, 257/461, 463, 464, 233; 438/48, 87, 309

(56) References Cited

U.S. PATENT DOCUMENTS

| 5,898,196 A | * | 4/1999 | Hook et al. ............... 257/292 |
| 5,936,230 A | * | 8/1999 | Street ................. 250/214 VT |
| 5,977,576 A | * | 11/1999 | Hamasaki ............... 257/292 |
| 6,084,259 A | * | 7/2000 | Kwon et al. ............. 257/292 |
| 6,100,551 A | * | 8/2000 | Lee et al. ............... 257/232 |
| 6,184,055 B1 | * | 2/2001 | Yang et al. ............... 438/57 |
| 6,218,691 B1 | * | 4/2001 | Chung et al. ............. 257/290 |

* cited by examiner

Primary Examiner—Tom Thomas
Assistant Examiner—Donghee Kang
(74) Attorney, Agent, or Firm—Akin Gump Strauss Hauer & Feld LLP

(57) ABSTRACT

The invention is directed to an image sensor with enhanced blue response and limited cross-talk. The image sensor is made of a photodiode layer. Disposed on one side of the photodiode layer is a substrate layer made out of an oppositely charged semiconductor material. The substrate layer is further defined by two different sub-layers, where the doping densities of the sub-layers differ. This difference in doping creates a deep electric field that inhibits carriers from moving to another sensor. Additionally, the potential of the deep electric field directs these carriers back to the N-P junction formed by the substrate layer and the photodiode layer. Working in conjunction with this, a shallow implant layer is disposed on the opposite side of the photodiode layer. The shallow implant layer creates an electric field between the photodiode layer and the shallow implant layer, directing carriers to the photodiode layer. As such, carriers generated in the shallow areas of the image sensor are discouraged from surface recombination effects.

11 Claims, 6 Drawing Sheets

IMAGE SENSOR WITH ENHANCED BLUE RESPONSE AND SIGNAL CROSS-TALK SUPPRESSION

BACKGROUND

1. Technical Field

The present invention is directed to imaging sensors and associated imaging devices. In particular, the invention is directed towards a more efficient image sensor having enhanced blue response and cross-talk suppression based on properly positioned and doped wires of a semiconductor substrate.

2. Related Art

Charge Coupled Device (CCD) technologies have always customized the fabrication process to properly position the junctions and depletion depths for optimal spectral sensitivities and minimum cross-talk. In the course of using standard CMOS technologies to build image sensors, attention needs to be paid to the location depth of photodiode junctions.

The depth of the depletion of the photodiode is also important as well. This, in combination with the depth of the photodiode junctions, determine the spectral sensitivity and optical cross-talk of an imager.

Standard CMOS technology indicates the edge of the depletion region, meaning the junction depth plus the depletion depth of a source/drain diode at VDD reversed bias, ranges from 0.25 micron to 0.8 micron.

Comparing these depths with the penetration depth of visible light in silicon, it is apparent that for standard CMOS imagers that most photo carriers are generated in the neutral region. Thus, photo carriers cannot be efficiently collected for the imaging process. Further, this allows for the possibility of excessive cross-talk.

In standard CMOS imagers, most photo carriers for blue light, however, are generated shallower in the substrate. This shallow generation of blue light photo carriers has the problem of surface recombination. Thus, the blue response in a standard CMOS imager is attenuated by this characteristic.

As the CMOS technology is scaled down, this non-optimal carrier collection situation gets worse. As such, present photodiode structures do not allow for enhanced blue response and do not allow for cross-talk suppression between image sensors.

Previous solutions employed standard CMOS N+–P– well or P+–N– well photodiode structures. These standard CMOS photodiode structures provide shallow junctions. As such these standard CMOS photodiode structures tend to have a low blue response and generate a potential cross-talk problem.

The blue color response in the standard CMOS photodiode structures compares relatively low to green and red color output CMOS photodiode structures. This is primarily due to the loss of photo generated carriers near the diode surface due to surface recombination.

Signal cross-talk in standard CMOS photodiode structures is also a problem due to the standard structure of these semiconductor devices. The shallow depletion region allows carrier diffusion to adjacent pixels, allowing for poor cross-talk responses in standard CMOS photodiode structures.

Many other problems and disadvantages of the prior art will become apparent to those schooled in the art after comparing such prior art with the present invention described herein.

BRIEF SUMMARY OF THE INVENTION

In short, the invention is a light sensor on a die. The light sensor is made of a photodiode layer, a substrate layer, and a carrier direction layer. The photodiode layer is made of a semiconductor material having a charge. The substrate layer is disposed on one side of the photodiode layer, and is made of a semiconductor material of an opposite charge than that of the photodiode layer.

A carrier direction layer is disposed between the surface of the die and the other side of the photodiode layer, opposite the substrate layer. The carrier direction layer is made of a semiconductor material. The material of the carrier direction layer and that of the photodiode layer produces an electric field between the photodiode layer and the carrier direction layer. In this manner photogenerated carriers produced in the photodiode layer or, in the charge collection layer are directed to the photodiode layer by the electric field.

In one embodiment of the invention, the substrate layer is made of P-type semiconductor material. Thus, the photodiode would be made of an N-type semiconductor material.

In another embodiment, the carrier direction layer is made of P-type semiconductor material. In this case, the P-type carrier direction layer and the N-type photodiode layer creates an electric field in which electron carriers are directed to the photodiode layer.

In another embodiment, the carrier direction layer is made of N-type semiconductor material. In this case the carrier direction layer is made of a heavily doped (N+) semiconductor material while the photodiode would be made of a lighter doped (N–) semiconductor material. The resulting potential would direct holes to the photodiode layer.

In another embodiment, the substrate layer is made of a first layer and a second layer. The first and second layers produce an electric field directing carriers to the photodiode layer. In this case, the first layer could be made of a lightly doped P-type (P–) semiconductor material, and the second layer is made of a more heavily doped P-type (P+) semiconductor material. The first layer is disposed between the photodiode layer and the second layer.

In another embodiment, the light sensor contains a photodiode layer, a substrate layer, and a carrier direction layer, as described above. In this embodiment, the electric field created between the photodiode layer and the carrier direction layer serves to inhibit surface recombination of photogenerated carriers.

In yet another embodiment, the light sensor contains a photodiode layer, a substrate layer, and a carrier direction layer, as described above. The substrate layer is made of two layers of different doping densities. The substrate layers create a deep electric field that serves to inhibit cross-talk of carriers.

In another embodiment, the invention is a light imager having a plurality of light sensors and control circuitry. The control circuitry controls the output of the plurality of light sensors.

The plurality of light sensors are made of a photodiode layer, a substrate layer, and a charge direction layer, as described previously. The plurality of light sensors may take all the forms of the above mentioned embodiments of the light sensor.

Other aspects of the present invention will become apparent with further reference to the drawings and specification that follow.

DETAILED DESCRIPTION OF THE INVENTION

Figure 1:
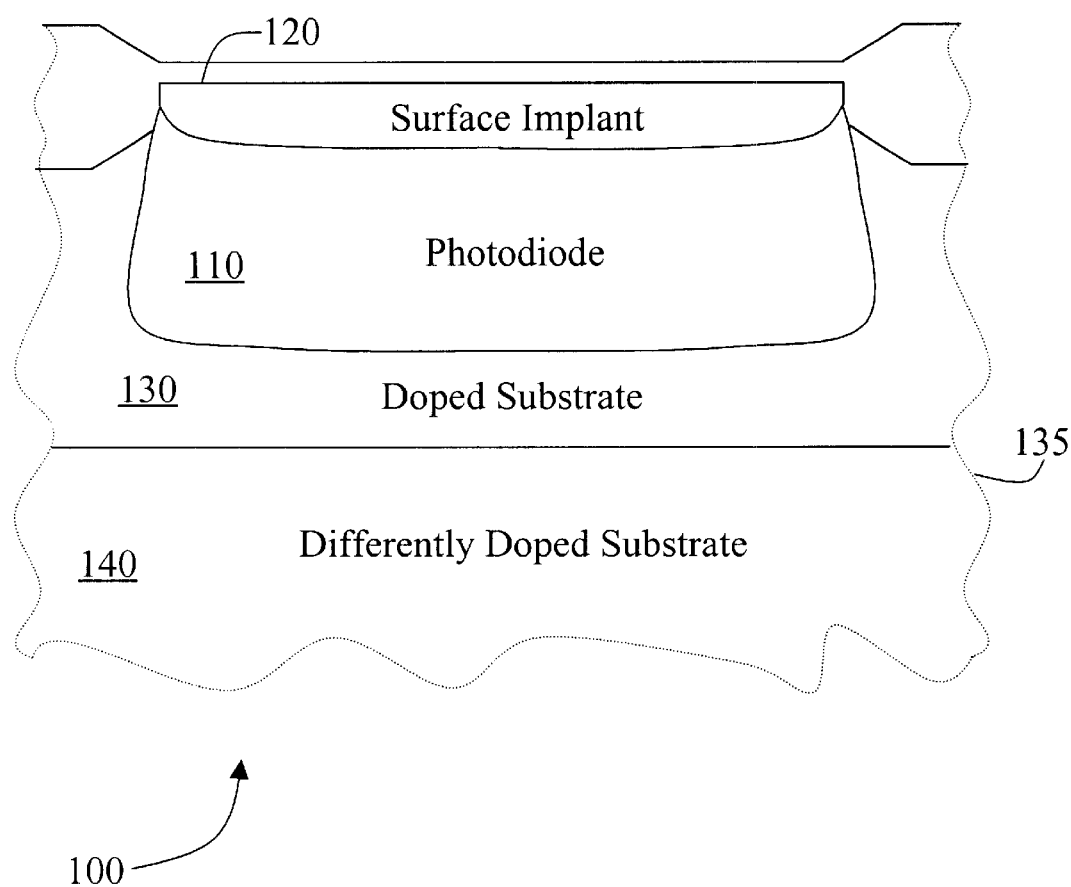
FIG. 1 is a structural block diagram of an active image sensor element with enhanced blue response and signal cross-talk suppression according to the invention.

FIG. 1 is a structural block diagram of an active image sensor element with enhanced blue response and signal cross-talk suppression according to the invention. A die 100 contains an image sensor element.

The die is made of a doped semiconductor substrate 135, containing two different doping density layers of semiconductor material. A pixel element sensor is disposed on the doped semiconductor substrate 135.

The pixel element sensor has a photodiode 110. The photodiode 110 is made out of a differently doped semiconductor material from the semiconductor substrate 135. For example, if the semiconductor substrate were made of a P-type semiconductor material, the photodiode would be made of a different type doped material, such as an N-type material.

The pixel element sensor also comprises a shallow implant region 120. The surface implant region 120 is disposed on the photodiode 110, between the photodiode 110 and the surface of the die 100.

The surface implant region 120 can be made of a differently doped material than the photodiode 110. For example, if the photodiode 110 is made of a N-type material, the surface implant region would be made of a P-type material.

Or, the surface implant region 120 can be made of a material that is the same doping type as the photodiode 110, but at a different doping density. For example, if the photodiode region 110 is made of an N- (lightly doped N-type) semiconductor material, the surface implant region 120 would be made of a N+(highly doped N-type) semiconductor material.

As such, the surface implant region 120 repels photo-generated minority carriers away from the surface towards the N-P junction formed between the photodiode 110 and the substrate 135 to be collected. Thus, the photo-generated carriers generated in the shallow regions of the image sensor structure are directed towards the collection junction. As such, the loss of sensor response due to surface recombination of the photo-generated carrier in the shallow regions near the diode surface is substantially diminished.

Additionally, the substrate layer surrounding the photodiode can be made of two different layers, a first substrate layer 130 and a second substrate layer 140. The first substrate layer 130 should be made out of an oppositely charged semiconductor material than that of the photodiode 110. This is necessary to create the N-P semiconductor junction necessary for the image sensor to work properly. For example, should the photodiode area 110 be made of an N-type material, the first substrate layer 130 should be made out of a P-type layer, and vice versa.

In an embodiment of the invention, a second substrate layer 140 is also present. This second substrate layer 140 is of the same semiconductor type material as the first substrate layer 130, but at a different doping density. As such, a deep level potential gradient is created within the die 100 due to the different doping densities of the first substrate layer 130 and the second substrate layer 140. The resulting built-in electric field deep in the detector substrate caused by the differences in the doping of the first substrate layer 130 and the second substrate layer 140 can assist in repelling photo-generated charges back into the active region.

As a result, the sensitivity of the sensor increases and the cross-talk decreases. As shown, the invention can be manufactured to minimize carrier surface recombination. This allows for enhanced blue response, since the blue generated photo carriers are generated nearer the surface than the wave lengths of green or red. Thus, the structure of the active image sensor of FIG. 1, by repelling the photo-generated carriers back into the area in which they may be collected, provides for a better and enhanced blue response in a image sensor. The deep electric field prevents cross-talk. As such, a pixel with greater response and efficiency is depicted.

Figure 2:
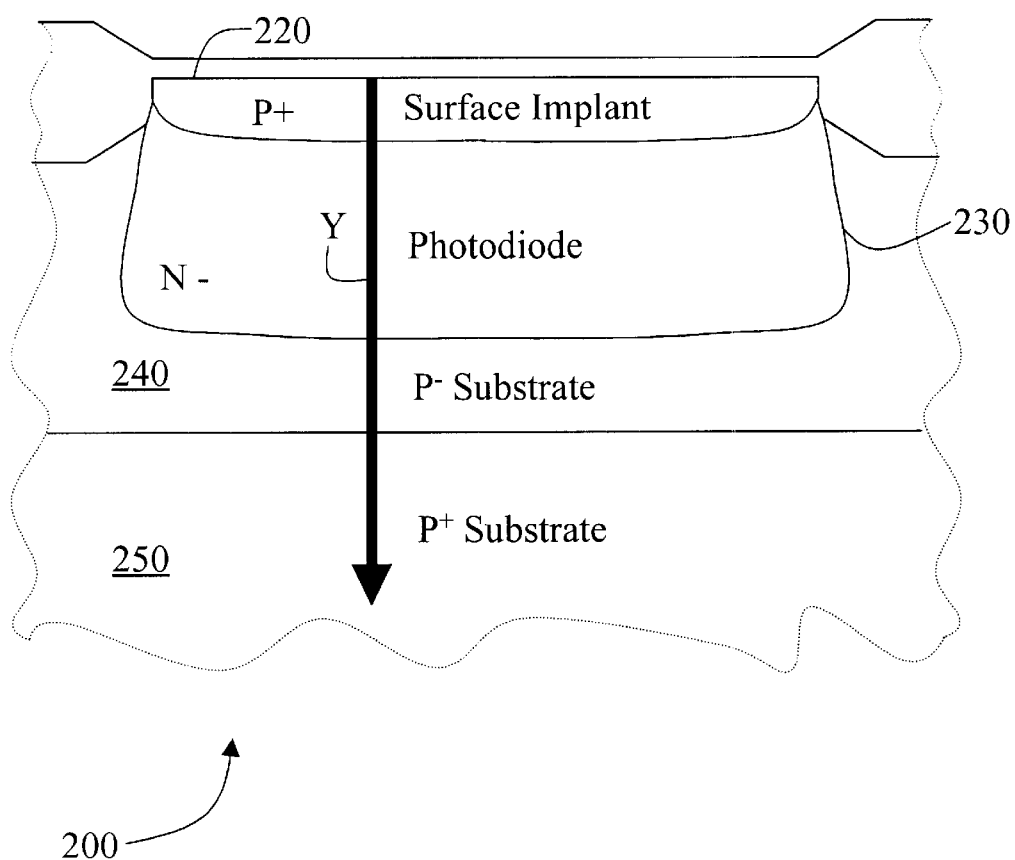
FIG. 2 is a structural diagram of an embodiment of the image sensor with enhanced blue response and signal cross-talk suppression of FIG. 1.

FIG. 2 is a structural diagram of an embodiment of the image sensor with enhanced blue response and signal cross-talk suppression of FIG. 1. A die 200 contains an image sensor made of several layers of semiconductor materials.

First, a heavily doped P-type material (P+) makes up the deepest substrate level 250 of a image sensor with enhanced blue response and signal cross-talk suppression in a die 200. A lightly doped P-type (P−) substrate layer 240 is disposed on the heavily doped P+ type substrate layer 250. These structures thus form an electric field between the P− substrate layer 240 and the P+substrate layer 250 in the image sensor. As such, a potential gradient is formed by the two substrate layers 240 and 250.

A photodiode 230 is then disposed on the P− substrate layer 240. The photodiode is made of a lightly doped N-type material (N− material). The junction between the photodiode 230 and the P− substrate layer 240 forms the N− P junction required for collection in the functioning of the sensor.

A shallow implant layer 220 is disposed on the surface of the photodiode layer 230. This shallow implant layer 220 is made of heavily doped P-type (P+) material. The P+ shallow implant layer 220 pins the surface potential of the image sensor. This surface implant layer 220 repels the photo-generated minority carriers, in this case electrons, away from the surface and toward the junction to be collected. Thus greatly aids in the enhancement of a shallow generated blue signal. Additionally, surface recombination of the carriers is diminished.

Secondly, the potential gradient formed by the P+ substrate 250 layer and the P− substrate layer 240 enhances charge collection efficiency in the image sensor. The deeper electric field formed by the P+ substrate layer 250 and the P− substrate layer 240 also serves to decrease cross talk between image sensors. This occurs since the photo generated carriers are swept by the field created by the P+ substrate layer 250 and the P− substrate layer 240 towards the N-P junction 245 defined by the photodiode layer 230 and the P− substrate layer 240.

Figure 3:
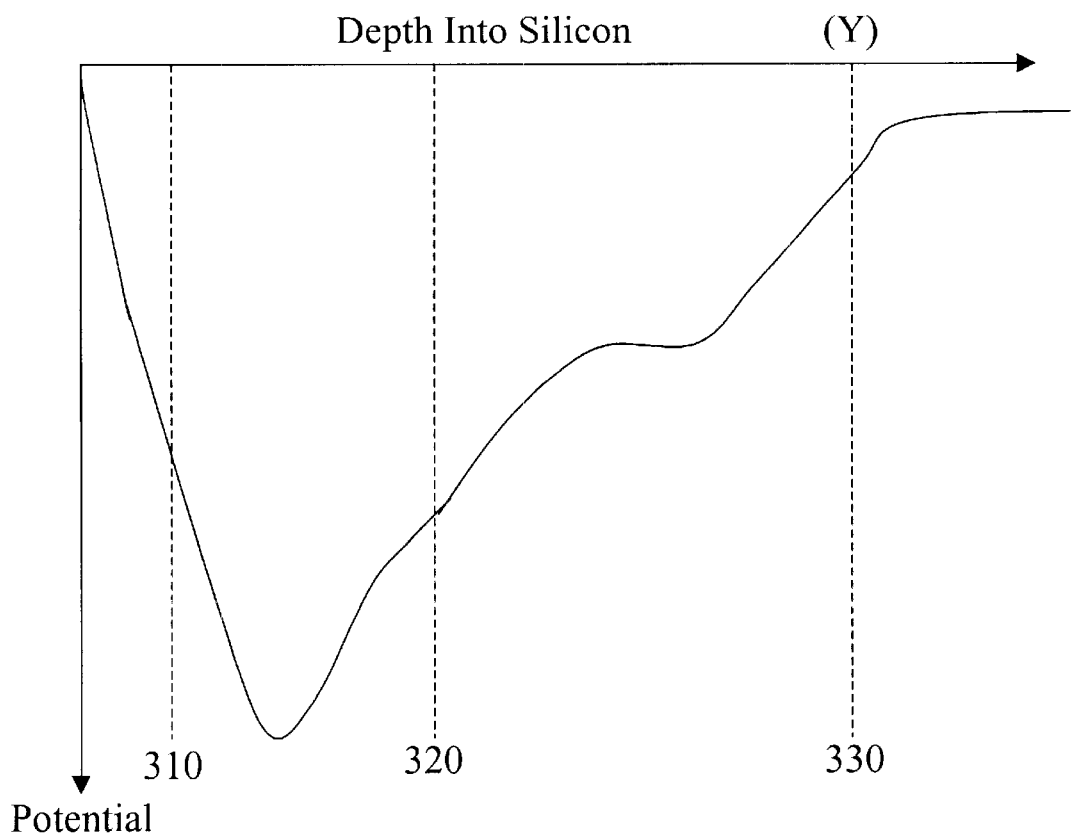
FIG. 3 is a potential diagram of the image sensor with enhanced blue response and signal cross-talk suppression of FIG. 2 in a direction through the layers making up the image sensor.

FIG. 3 is a potential diagram of the image sensor with enhanced blue response and signal cross-talk suppression of FIG. 2 in a direction through the layers making up the image sensor. The functionality of the present invention may be clearly shown by the potential profile of the photodetector of FIG. 2.

The horizontal axis of FIG. 3 corresponds to the orientation arrow Y of FIG. 2. The dashed line 310 represents the depth into the die 200 of FIG. 2 at which junction between the P+ surface implant layer 220 and the photodiode layer 230 is. The dashed line 320 of FIG. 3 corresponds to the depth; into the die 200 of FIG. 2 at which the photodiode layer 230 and the first P-type layer 240 junction is created. Likewise the dashed line 330 in FIG. 3 corresponds to the depth into the die 200, FIG. 2, corresponding to the junction of the P− substrate layer 240 and the P+ substrate layer 250. The vertical axis of the potential diagram of FIG. 3 corresponds to the potential at the corresponding depth into the die 200 of FIG. 2.

Thus as shown, a very high potential gradient exists between the P+ surface implant layer 220 and the photodiode layer 230 of FIG. 2. As can be clearly shown by the potential profile of the image sensor of FIG. 2, the photo-generated carriers (electrons, in this case) will clearly be directed back away from the surface and towards the N-P junction formed by the photodiode 230 and the first P− substrate layer, where they will be collected.

Additionally, the potential created by the layering of the P− substrate layer 240 and the P+ substrate layer 250 also create a similar effect, directing photo-generated charges back into the active region. Also, photo-generated charges are discouraged from leaving the active region because of the potential between the substrate layers 240 and 250. Thus, the cross-talk due to the migration of photo-generated charges is discouraged or reduced on other nearby sensors.

Figure 4:
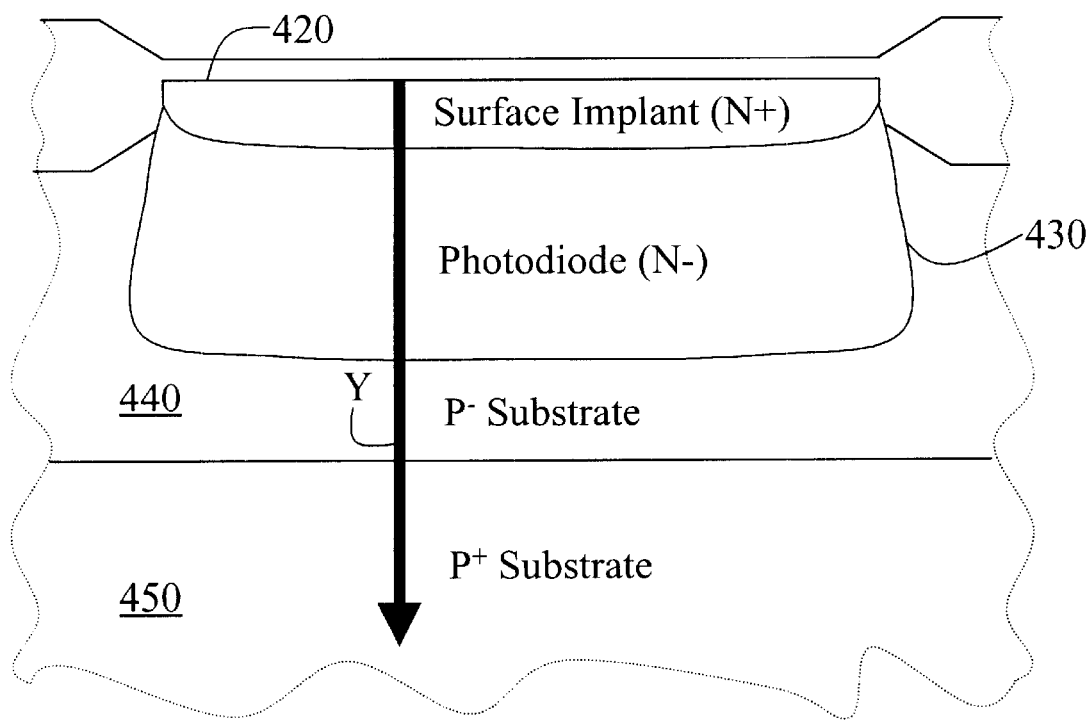
FIG. 4 is a structural diagram of an alternative embodiment of the image sensor with enhanced blue response and signal cross-talk suppression of FIG. 1.

FIG. 4 is a structural diagram of an alternative embodiment of the image sensor with enhanced blue response and signal cross-talk suppression of FIG. 1. Similar to the embodiment as envisioned in FIG. 3, this embodiment of the invention also contains a P+ substrate layer 450 as a base layer in the die 400. Again, as in FIG. 2, a P− substrate layer 440 is formed and disposed on the P+ substrate layer 450.

A photodiode layer 430 is formed with a junction to the P− substrate layer 440. The photodiode 430 is made of an N-type material, in this case a lightly doped N+ material, thus providing for the P-N junction necessary in the operation of a semiconductor photo collection device.

A surface implant layer 420 is formed and is disposed on the photodiode 430. The surface implant layer 420 is made of a heavily-doped N-type material (N+). This structure uses the shallow implant layer 420 and the photodiode layer 430 to create a built-in electric field near the detector surface. The shallow formed photogenerated minority carriers, holes in this case, are directed by this built-in electric field into the photodiode 420, and towards the active region of the sensor. As such, these photogenerated minority carriers are repelled away from the surface and towards the P-N junction formed by the photodiode layer 430 and the P− substrate layer 440 to be collected.

This resulting electric field directs the photogenerated minority carriers back to the active region of the image sensor, and inhibits surface recombination for carriers generated in the shallow regions of the die 400. As such, the blue response of the image sensor as envisioned in FIG. 4 is enhanced.

Figure 5:
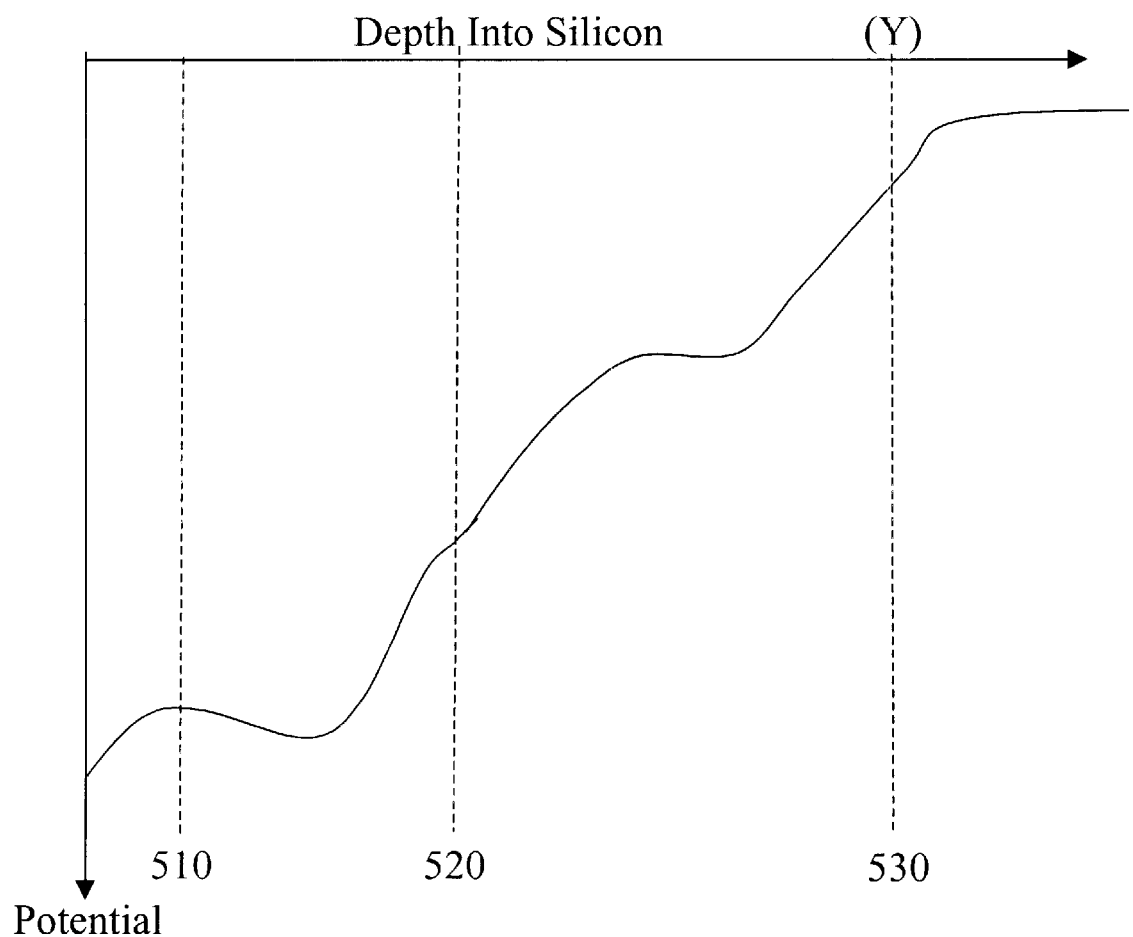
FIG. 5 is a potential diagram of the image sensor with enhanced blue response and signal cross-talk suppression of FIG. 4 in a direction through the layers making up the image sensor.
Figure 6:
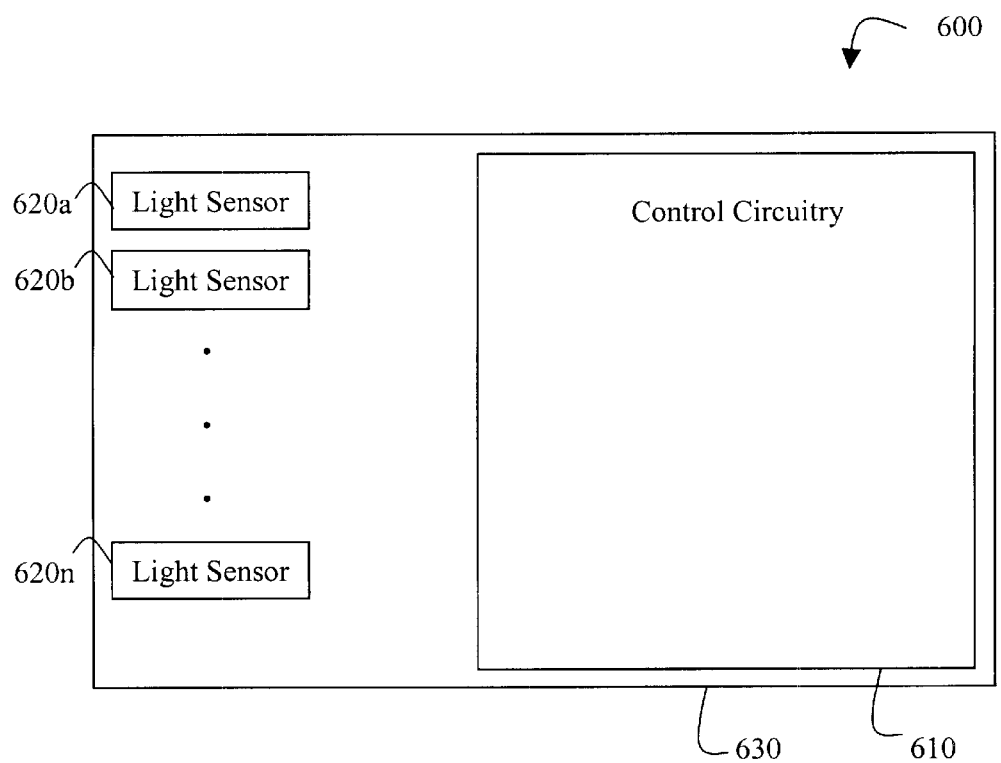
FIG. 6 is a schematic block diagram of a light imager employing the light sensor of FIGS. 1, 2, and 4.

FIG. 5 is a potential diagram of the image sensor with enhanced blue response and signal cross-talk suppression of FIG. 4 in a direction through the layers making up the image sensor. The functionality of the present invention may be clearly shown by the potential profile of the photodetector of FIG. 4.

The horizontal axis of FIG. 5 corresponds to the orientation arrow Y of FIG. 4. The dashed line 510 represents the depth into the die 400 of FIG. 4 at which junction between the N+ surface implant layer 420 and the photodiode layer 430 is. The dashed line 520 of FIG. 5 corresponds to the depth into the die 400 of FIG. 4 at which the junction between the photodiode layer 430 and the first P-type layer 440 is. Likewise the dashed line 530 in FIG. 5 corresponds to the depth into the die 400, FIG. 4, corresponding to the junction of the P− substrate layer 440 and the P+ substrate layer 450, in FIG. 4. The vertical axis of the potential diagram of FIG. 5 corresponds to the potential at the corresponding depth into the die 400 of FIG. 4.

Thus as shown, a high potential gradient exists between the N+ surface implant layer 420 and the photodiode layer 430 of FIG. 4. As can be clearly shown by the potential profile of the image sensor of FIG. 4, the photo-generated carriers (holes, in this case) will clearly be directed back away from the surface and towards the N-P junction formed by the photodiode 430 and the first P− substrate layer, where they will be collected.

Additionally, the potential created by the layering of the P− substrate layer 440 and the P+ substrate layer 450 also aids in diminishing cross-talk.

Additionally, the actual doping types of layers may be further used to enhance the sensitivity of an image sensor made with the invention disclosed. For example, doping with different materials may lead to better responses. Smaller mass dopants may be implanted further into a substrate. Thus, the active region in the image sensor may be increased by using these smaller mass dopants, leading to a greater efficiency in photo generated charge collection.

A high doping concentration of the photodiode region relative to the doping density of the substrate can cause a poor response due to a decrease of the active region. Using a lightly doped region may further enhance the characteristics of the invention due to the increase of the active area. Thus, the combination of doping concentrations and species of dopants can be used concurrently to enhance the response of the image sensor.

Thus, the invention shows an image sensor with enhanced blue response and signal cross-talk suppression. This is made possible by the interweaving of heavily and lightly doped layers within the sensor, as well as layers made of different semiconductor types. This creates a mechanism by which photocarriers generated in a neutral region may be channeled or directed back into the active region for more efficient collection. Additionally, the deep electric potentials created by materials of the deeper substrates enhance the charge collection, and discourage cross-talk of photogenerated carriers.

It should be noted that several technologies exist for the manufacture of the light sensors as described above. The light sensors of FIGS. 1, 2, and 4 may presently be made with standard semiconductor fabrication technologies.

A light imager 600 is made of a control circuitry 610 and a plurality of light sensors 620a–n are disposed on a die 630. The plurality of light sensors are manufactured in accordance with the structures described above. The control circuitry 610 directs and controls the outputs of the plurality of light sensors 620a–n.

In view of the above detailed description of the present invention and associated drawings, other modifications and variations will now become apparent to those skilled in the art. It should also be apparent that such other modifications and variations may be effected without departing from the spirit and scope of the present invention as set forth in the claims which follow.

I claim:

1. A light sensor on a die, the light sensor comprising:
   a photodiode layer made of a semiconductor material having a charge;
   a substrate layer, disposed on a first side of the photodiode layer, made of a semiconductor material of an opposite charge than that of the semiconductor material making up the photodiode layer;
   a heavily doped carrier direction layer made of N-type semiconductor material, disposed between the surface of the die and a second side of the photodiode layer, that aids in the enhancement of a shallow generated blue signal, the second side of the photodiode layer opposite the substrate layer;
   an electric field between the photodiode layer and the carrier direction layer; and
   a surface region inhibiting recombination of photogenerated carriers.

2. The light sensor of claim 1 wherein the substrate layer is made of P-type semiconductor material.

3. The light sensor of claim 1 wherein the carrier direction layer is made of P-type semiconductor material.

4. The light sensor of claim 1 wherein the substrate layer comprising:
   a first layer;
   a second layer; and
   the first layer and the second layer producing an electric field directing carriers to the photodiode layer.

5. The light sensor of claim 4 wherein:
   the first layer comprising a lightly doped semiconductor material;
   the second layer comprising a more heavily doped semiconductor material than the semiconductor material of the first layer; and
   the first layer disposed between the photodiode layer and the second layer.

6. A light imager comprising:
   a plurality of light sensors, the plurality of light sensors comprising:
      a photodiode layer made of a semiconductor material having a charge;
      a substrate layer, disposed on a first side of the photodiode layer, made of a semiconductor material of an opposite charge than that of the semiconductor material making up the photodiode layer;
      a heavily doped carrier direction layer made of N-type semiconductor material, disposed between the surface of the die and a second side of the photodiode layer, that aids in the enhancement of a shallow generated blue signal, the second side of the photodiode layer opposite the first side of the photodiode layer, the carrier direction layer made of a semiconductor material;
      an electric field between the photodiode layer and the carrier direction layer;
      a surface region inhibiting recombination of photogenerated carriers; and
   control circuitry, communicatively coupled to the plurality of light sensors, controlling the output of the plurality of light sensors.

7. The light imager of claim 6 wherein the substrate layer is made of P-type semiconductor material.

8. The light imager of claim 6, wherein the carrier direction layer is made of P-type semiconductor material.

9. The light imager of claim 6 wherein the carrier direction layer is made of N-type semiconductor material.

10. The light imager of claim 6 wherein the substrate layer comprising:
    a first layer;
    a second layer; and
    the first layer and the second layer producing an electric field that directs carriers to the photodiode layer.

11. The light imager of claim 10, wherein:
    the first layer comprising a lightly doped semiconductor material;
    the second layer comprising a more heavily doped semiconductor material than the semiconductor material of the first layer; and
    the first layer disposed between the photodiode layer and the second layer.

* * * * *